United States Patent
Wu et al.

(10) Patent No.: US 10,546,907 B2
(45) Date of Patent: Jan. 28, 2020

(54) OLED DISPLAY PANEL, METHOD OF MANUFACTURING THE SAME, OLED DISPLAY

(71) Applicants: BOE TECHNOLOGY GROUP CO., LTD., Beijing (CN); Hefei Xinsheng Optoelectronics Technology Co., Ltd., Anhui (CN)

(72) Inventors: Xinfeng Wu, Beijing (CN); Mengyu Luan, Beijing (CN); Youyuan Hu, Beijing (CN); Fei Li, Beijing (CN); Xinzhu Wang, Beijing (CN); Huihui Li, Beijing (CN)

(73) Assignees: BOE TECHNOLOGY GROUP CO. LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days.

(21) Appl. No.: 15/773,571

(22) PCT Filed: Sep. 28, 2017

(86) PCT No.: PCT/CN2017/104034
§ 371 (c)(1),
(2) Date: May 4, 2018

(87) PCT Pub. No.: WO2018/196279
PCT Pub. Date: Nov. 1, 2018

(65) Prior Publication Data
US 2019/0081123 A1   Mar. 14, 2019

(30) Foreign Application Priority Data
Apr. 24, 2017 (CN) .......................... 2017 1 0271495

(51) Int. Cl.
*H01L 51/00* (2006.01)
*H01L 27/32* (2006.01)
(Continued)

(52) U.S. Cl.
CPC ...... *H01L 27/3276* (2013.01); *H01L 51/5012* (2013.01); *H01L 51/5206* (2013.01);
(Continued)

(58) Field of Classification Search
None
See application file for complete search history.

(56) References Cited

U.S. PATENT DOCUMENTS

2007/0187676 A1* 8/2007 Park .................... H01L 27/1285
257/40
2010/0156763 A1   6/2010 Lee et al.
(Continued)

FOREIGN PATENT DOCUMENTS

CN       1588501 A    3/2005
CN     103337513 A   10/2013
(Continued)

OTHER PUBLICATIONS

Search Report for International Application No. PCT/CN2017/104034 dated Jan. 16, 2018.
(Continued)

*Primary Examiner* — Hung K Vu
(74) *Attorney, Agent, or Firm* — Calfee, Halter & Griswold LLP (57) ABSTRACT

The present disclosure relates to an organic light emitting diode (OLED) display panel, an OLED display and an OLED unit. The OLED display panel includes: a scan line, extending along a first direction; a data line, extending along a second direction perpendicular to the first direction; an OLED unit, including a first electrode, a second electrode,
(Continued)

and an organic light emitting layer formed between the first electrode and the second electrode; and a heat conducting layer, formed of an insulating heat conduction material and connected to the scan line, the data line, and the first electrode in the OLED unit.

20 Claims, 5 Drawing Sheets

(51) Int. Cl.
*H01L 51/52* (2006.01)
*H01L 51/50* (2006.01)
*H01L 51/56* (2006.01)

(52) U.S. Cl.
CPC ........ *H01L 51/529* (2013.01); *H01L 51/5221* (2013.01); *H01L 51/56* (2013.01)

(56) References Cited

U.S. PATENT DOCUMENTS

| | | | |
|---|---|---|---|
| 2011/0215342 A1* | 9/2011 | Oliver | B29C 43/18 257/81 |
| 2013/0084663 A1* | 4/2013 | Wang | G02F 1/13394 438/34 |
| 2015/0162346 A1 | 6/2015 | Choi et al. | |

FOREIGN PATENT DOCUMENTS

| | | |
|---|---|---|
| CN | 104504998 A | 4/2015 |
| CN | 104716111 A | 6/2015 |
| CN | 107068724 A | 8/2017 |

OTHER PUBLICATIONS

First Office Action for Chinese Patent Application No. 2017102714955 dated Apr. 3, 2019.

\* cited by examiner

OLED DISPLAY PANEL, METHOD OF MANUFACTURING THE SAME, OLED DISPLAY

CROSS REFERENCE

The present application is based upon International Application No. PCT/CN2017/104034, filed on Sep. 28, 2017, which claims the priority of Chinese Patent Application No. 201710271495.5, and filed on Apr. 24, 2017, and the entire contents thereof are incorporated herein by reference.

TECHNICAL FIELD

The present disclosure relates to the field of organic light emitting technology. More specifically, the present disclosure relates to an OLED display panel with improved heat dissipation efficiency, a method of preparing the same, and an OLED display.

BACKGROUND

With booming development of the display industry, Active Matrix Organic Light Emitting Diode (AMOLED) displays are increasingly accepted by the market due to their characteristics of thinness, lightness, active light emission (no backlight required), no viewing angle problems, high definition, high brightness, fast response, low power consumption, wide operating temperature, strong anti-knock capability and flexible. Under current technical conditions, a luminescent material is highly susceptible to the temperature. The luminescent chromaticity is seriously shifted, the luminous efficiency is greatly reduced, and the product life will also be rapidly attenuated.

With the diversification and refinement of people's daily needs, the demand for large-size AMOLED display panels as TV display screens has grown. However, a film layer where the luminescent material is located is between a layer of an anode and a layer of a cathode. The light emission is controlled by turning on and off a TFT circuit, a certain amount of heat is released during the light emitting process due to the essential property of the material.

It should be noted that, information disclosed in the above background portion is provided only for better understanding of the background of the present disclosure, and thus it may contain information that does not form the prior art known by those ordinary skilled in the art.

SUMMARY

Aspects of the present disclosure provide an OLED display panel, a method of manufacturing the same, an OLED display and an OLED unit.

According to one aspect of the present disclosure, an OLED display panel includes: a scan line, extending along a first direction; a data line, extending along a second direction perpendicular to the first direction; an OLED unit, including a first electrode, a second electrode, and an organic light emitting layer formed between the first electrode and the second electrode; and a heat conducting layer, formed of an insulating heat conduction material and connected to the scan line, the data line, and the first electrode in the OLED unit.

Optionally, the first electrode is an anode.

Optionally, the heat conducting layer is formed in a non-light-emitting region of the OLED display panel.

Optionally, the first electrode is formed of a transparent conductive material.

Optionally, the heat conducting layer is connected to an edge portion of the first electrode.

Optionally, the OLED display panel further includes: a second heat conducting layer covering the scan line and the data line respectively.

Optionally, the second heat conducting layer has the same pattern as the scan line and the data line.

Optionally, the heat conducting layer includes a BeO film.

Optionally, the heat conducting layer is connected to the first electrode through a via hole.

According to another aspect of the present disclosure, an OLED display includes: the OLED display panel according to any embodiment of the present disclosure; a source driver, connected to the data line; and a scan driver, connected to the scan line.

According to another aspect of the present disclosure, a method of manufacturing an OLED display panel includes: forming a scan line extending along a first direction and a data line extending along a second direction perpendicular to the first direction; forming a heat conducting layer, the heat conducting layer being connected to the scan line and the data line; and forming a first electrode, the first electrode being connected to the heat conducting layer, wherein the heat conducting layer is formed of an insulating heat conduction material.

Optionally, the heat conducting layer is formed in a non-light-emitting region of the OLED display panel.

Optionally, the first electrode is formed of a transparent conductive material.

Optionally, the heat conducting layer is connected to an edge portion of the first electrode.

Optionally, the method further includes: forming a second heat conducting layer covering the scan line and the data line respectively.

Optionally, the second heat conducting layer has the same pattern as the scan line and the data line.

Optionally, the heat conducting layer includes a BeO film.

Optionally, the heat conducting layer is formed by pyrolysis CVD.

Optionally, the heat conducting layer is connected to the first electrode through a via hole.

According to another aspect of the present disclosure, an OLED unit includes: a bottom electrode; an organic light emitting layer, formed on the bottom electrode; a transmission electrode, formed on the organic light emitting layer, and located in a light emitting region of the OLED unit; and a heat conducting layer, formed in the non-light-emitting region of the OLED unit and connected to the transmission electrode, the heat conductive layer being formed of an insulating heat conduction material.

Optionally, the heat conducting layer includes a BeO film.

Optionally, the heat conducting layer is connected to the transmission electrode through a via hole.

It is to be understood that both the foregoing general description and the following detailed description are exemplary and explanatory only and are not restrictive of the invention, as claimed.

This section provides a summary of various implementations or examples of the technology described in the disclosure, and is not a comprehensive disclosure of the full scope or all features of the disclosed technology.

It is to be understood that both the foregoing general description and the following detailed description are exemplary and explanatory only and are not restrictive of the present disclosure.

BRIEF DESCRIPTION OF THE DRAWINGS

The drawings are intended to provide a further understanding of the present disclosure and constitute a part of the specification, and together with the following detailed description, serve to explain the present disclosure but do not constitute a limitation of the present disclosure. In the drawings.

DETAILED DESCRIPTION

To enable those skilled in the art to better understand the technical solutions of the present disclosure, an OLED display panel, a method of manufacturing the same, an OLED display and an OLED unit provided by the present disclosure will be further described in detail with reference to the accompanying drawings and specific embodiments.

Figure 1:
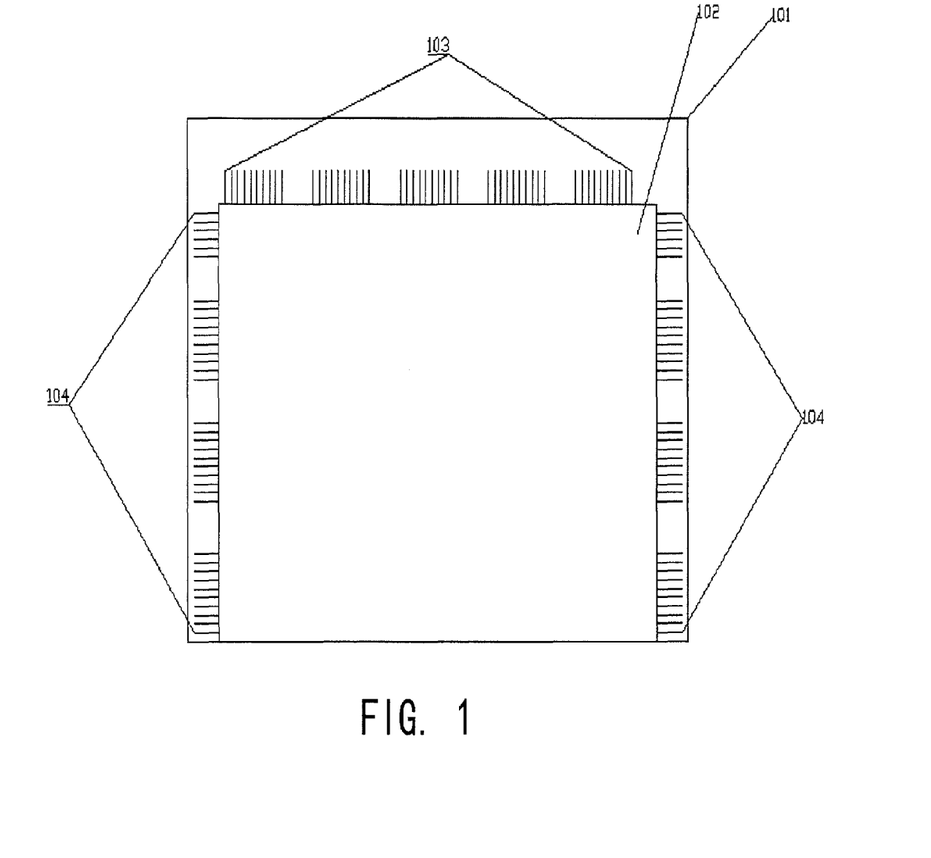
FIG. 1 is a schematic top view of an OLED display panel according to an embodiment of the present disclosure.

FIG. 1 is a schematic top view of an OLED display panel according to an embodiment of the present disclosure. Referring to FIG. 1, an OLED display panel according to an embodiment of the present disclosure includes a first substrate 101, a second substrate 102, a data line 103, and a scan line 104.

The first substrate 101 may be a backplane of an OLED display panel. Although not shown, an array substrate of a thin film transistor (TFT) array may be included on the first substrate 101, and the first substrate 101 may include various circuit structures and/or substrate structures as needed.

The second substrate 102 is disposed opposite to the first substrate. A circuit structure such as an organic light emitting layer, a cathode layer may be formed on the second substrate 102. An OLED display panel may be formed by forming a circuit structure such as a TFT array, a data line, a scan line, an anode layer on the first substrate 101, forming a circuit structure such as an organic light emitting layer, a cathode layer on the second substrate 102, and then forming a cell assembly of the first substrate 101 and the second substrate 102.

It should be understood that the above structures of the first substrate 101 and the second substrate 102 in this embodiment are merely examples, and the present disclosure is not limited thereto. The first substrate 101 and the second substrate 102 may not be limited to the above structures. For example, structures such as the TFT array, the anode layer, the organic light emitting layer, the cathode layer, and the like may all be formed on the first substrate 101. In this case, the second substrate 102 may be a package substrate or a package film. In other embodiments, other circuit structures, substrate structures or package structures may also be included in the OLED display panel, which will not be repeated herein.

The scan line 104 is formed on the first substrate and extends in a first direction (for example, a horizontal direction). A data line 103 is formed on the first substrate and extends in a second direction (e.g., a vertical direction) perpendicular to the first direction. An OLED unit may be formed in a region where the scan line 104 intersects with the data line 103 (for example, the OLED unit may constitute a pixel unit of the display panel). The OLED unit is connected to the scan line 104 and the data line 103 respectively, to receive a scan signal and a data signal from the scan line 104 and the data line 103 respectively. In the present embodiment, the OLED unit may include a driving circuit and an organic light emitting diode (OLED), wherein the driving circuit may be connected to the scan line 104, and the OLED may be connected to the data line 103. More specifically, the OLED unit (particularly, an OLED portion therein) may include a first electrode, a second electrode, and an organic light emitting layer formed between the first electrode and the second electrode. In the embodiment, the first electrode may be connected to the data line 104, and the second electrode may be formed of a common electrode film layer in the OLED display panel.

In the present embodiment, although the structures of the OLED unit and the OLED are not described in detail, it will be understood by those skilled in the art based on the present disclosure that the present disclosure can be applied to OLED units of various structures. For example, in a driving portion of the OLED unit, a plurality of driving elements and compensation elements such as TFTs, capacitors, etc. may be included. In the OLED portion of the OLED unit, in addition to the first electrode, the organic light emitting layer, and the second electrode, it may also include various functional layers, such as a hole transport layer, a hole injection layer, an electron transport layer, an electron injection layer, and the like. The OLED unit may further include or add an optical structure to improve its light emitting effect, and embodiments of the present disclosure are not limited thereto.

In the OLED display panel, generally, the scan line 104 and the data line 103 are respectively formed in different layers on the first substrate 101. The scan lines 104 are connected to gate electrodes of switching transistors of respective pixels, to control on and off of the switching transistors through the scan signals (i.e., selecting a particular pixel or pixel row). The data line 103 is connected to a first electrode (e.g., an anode) of an organic light emitting diode (OLED) in each pixel, so as to provide a data signal to the OLED to control the light emitted from the OLED.

In this embodiment, the OLED display panel may further include a heat conducting layer (not shown in FIG. 1, referring to the specific embodiment below). The heat conducting layer is formed of an insulating heat conduction material and connected to the scan line 104, the data line 103, and the first electrode (not shown in FIG. 1, referring to the specific embodiment below) in the OLED unit.

An OLED display panel according to an embodiment of the present disclosure includes: a scan line, extending along a first direction; a data line, extending along a second direction perpendicular to the first direction; an OLED unit, including a first electrode, a second electrode, and an organic light emitting layer formed between the first electrode and the second electrode; and a heat conducting layer, formed of an insulating heat conduction material and connected to the scan line, the data line, and the first electrode in the OLED unit. According to the present disclosure, it may improve heat dissipation of the OLED, thereby avoiding problems such as shift of luminescent chromaticity, reduction of luminous efficiency, product attenuation and the like due to heat generation of the OLED.

Figure 2:
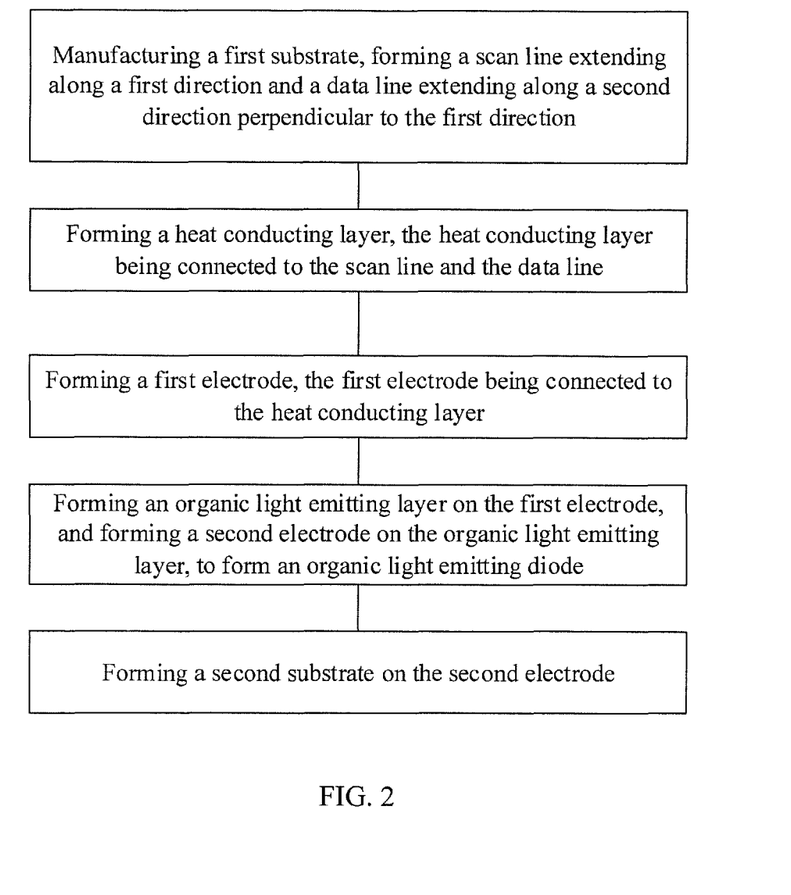
FIG. 2 is a schematic block diagram of a process of manufacturing an OLED display panel according to an embodiment of the present disclosure.

FIG. 2 is a schematic block diagram of a process of manufacturing an OLED display panel according to an embodiment of the present disclosure. Referring to FIG. 2, the process of manufacturing an OLED display panel may include: manufacturing a first substrate, wherein the first substrate may be the first substrate 101 as described in the foregoing embodiments. A person skilled in the art has grasped the preparation method thereof, and thus the specific formation process will not be repeated here.

In one embodiment, more specifically, the step of manufacturing the first substrate includes forming a scan line extending in a first direction and a data line extending in a second direction perpendicular to the first direction. The scan line is formed on a first substrate and extends in the first direction (for example, a horizontal direction). The data line is formed on the first substrate and extends in a second direction (for example, a vertical direction) perpendicular to the first direction. A pixel unit may be formed in a region where the scan line 104 intersects with the data line. The pixel unit is connected to the scan line and the data line respectively, to receive a scan signal and a data signal from the scan line and the data line respectively.

The process of manufacturing an OLED display panel may further include: forming a heat conducting layer on the first substrate, the heat conducting layer being connected to the scan line and the data line and the heat conducting layer being formed of an insulating heat conduction material; and forming a first electrode, the first electrode being connected to the heat conducting layer.

With the above process, the structure shown according to the foregoing embodiment of the present disclosure is formed on the first substrate of the OLED display panel. Therefore, the OLED display panel prepared according to the above process includes: a scan line, extending along a first direction; a data line, extending along a second direction perpendicular to the first direction; an OLED unit, including a first electrode, a second electrode, and an organic light emitting layer formed between the first electrode and the second electrode; and a heat conducting layer, formed of an insulating heat conduction material and connected to the scan line, the data line, and the first electrode in the OLED unit. According to the present disclosure, it may improve heat dissipation of the OLED, thereby avoiding problems such as shift of luminescent chromaticity, reduction of luminous efficiency, product attenuation and the like due to heat generation of the OLED.

The process of manufacturing the OLED display panel may further include: forming an organic light emitting layer on the first electrode, and forming a second electrode on the organic light emitting layer, to form an organic light emitting diode. In the present embodiment, the first electrode may be a reflective electrode and the second electrode may be a transmission electrode, but the present disclosure is not limited thereto. According to the actual light emitting requirement of the OLED display panel, the first electrode may be a transmission electrode and the second electrode may be a reflective electrode. Alternatively, both the first electrode and the second electrode may be transmission electrodes.

In an OLED display panel, the cathode of the OLED is usually formed as a common electrode film layer. For example, a large-area conductive film layer is generally used to form a cathode of the OLED, and a plurality of OLED units can share the cathode. In addition, the anode of the OLED is usually connected to a driving circuit, so the anode is usually formed as a separate electrode. In this case, the heat dissipation capacity of the anode is often poorer than that of the cathode. Therefore, in this embodiment, in order to improve the heat dissipation, the first electrode in the OLED display panel is an anode, so that the insulating heat conducting layer can help improve the heat dissipation ability of the anode.

The process of manufacturing an OLED display panel may further include: forming a second substrate on the second electrode. The second substrate may be a package substrate, a package film, or the like, and the present disclosure is not limited thereto.

Figure 3:
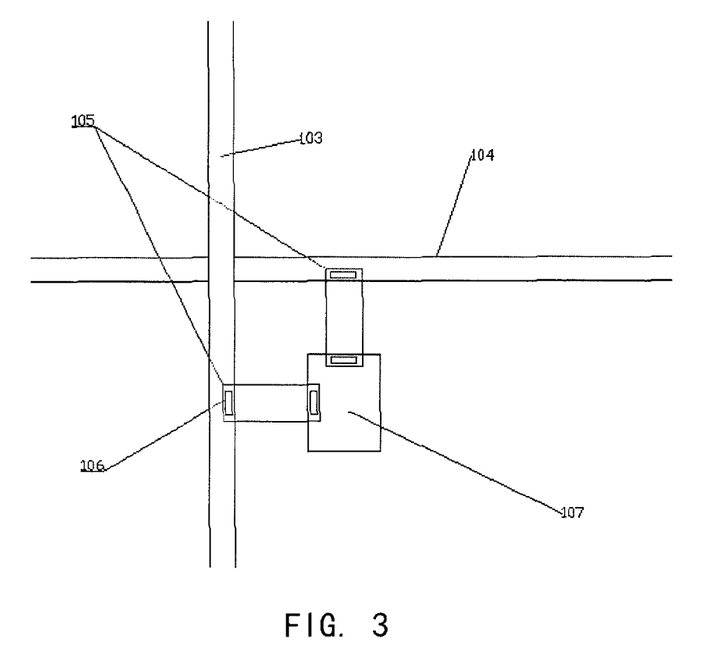
FIG. 3 is a schematic diagram of a pixel in an OLED display panel according to an embodiment of the present disclosure.

Hereinafter, the structure of a heat conducting layer in an OLED display panel according to an embodiment of the present disclosure will be described more specifically with reference to FIG. 3. FIG. 3 is a schematic diagram of a pixel in an OLED display panel according to an embodiment of the present disclosure.

Referring to FIG. 3, an OLED display panel may include: a scan line 104, extending along a first direction; a data line 103, extending along a second direction perpendicular to the first direction; an OLED unit, including a first electrode, a second electrode, and an organic light emitting layer formed between the first electrode and the second electrode; and a heat conducting layer 105, formed of an insulating heat conduction material and connected to the scan line, the data line, and the first electrode 107 in the OLED unit.

The pixel unit mainly includes a driving transistor and an organic light emitting diode. In the embodiment, a gate electrode of the drive transistor is connected to the scan line 104, a source electrode of the drive transistor is connected to the data line 103, and a drain electrode of the drive transistor is connected to the first electrode 107 of the organic light emitting diode. By using a scan signal from the scan line 104, the driving transistor controls the ON and OFF between the data line and the first electrode 107, thereby selectively transmitting the data signal to the first electrode 107. It should be understood that the pixel unit may also include other circuit structures, such as a light emission control transistor for controlling the light emission of the OLED, a storage capacitor for storing a data signal, and the like, which will not be described in detail herein.

In one pixel of the OLED display panel, the first electrode 107 may correspond to a light emitting region of the pixel, and a region (e.g., a region in which a circuit structure such as a driving transistor is formed) other than the first electrode 107 may correspond to a non-light-emitting region of the pixel. Correspondingly, a region of the OLED display panel corresponding to the first electrode of all pixels is a light emitting region of the OLED display panel, and a region other than the light emitting region corresponds to a non-light-emitting region of the OLED display panel.

Referring to FIG. 3, a heat conducting layer 105 is formed in the non-light-emitting region of the OLED display panel. In this case, the light shielding of the heat conducting layer 105 can be minimized, so as to avoid reducing an aperture ratio of the OLED display panel.

As shown in FIG. 3, in one embodiment, the heat conducting layer 105 is connected to an edge portion of the first electrode 107. In this case, the shielding of the light emitting region by the heat conducting layer 105 can be reduced, thereby ensuring that the light shielding of the heat conducting layer 105 is minimized, so as to avoid reducing the aperture ratio of the OLED display panel.

The first electrode 107 may constitute the anode of the OLED, for receiving a data signal from the data line, thus controlling the OLED to emit light with corresponding brightness. The first electrode 107 may be formed of a transparent conductive material, so that the OLED may emit light toward a direction of the first electrode 107.

As described in the foregoing embodiments, the present disclosure is not limited thereto. The OLED may also emit light toward a direction of the second electrode (for example, the cathode of the OLED) as needed. In this case, the second electrode may be formed to be a transmission electrode. Alternatively, the OLED may emit light toward two directions, in which case both the first and second electrodes may be formed as transmission electrodes.

In addition, as shown in FIG. 3, the heat conducting layer 105 may be formed in a different layer from the scanning line 104, the data line 103, and the first electrode 107. In this case, the heat conducting layer 105 may be connected to the scan line 104, the data line 103 and the first electrode 107 through a via hole 106 respectively. The via hole may be formed to have a sufficiently large size and may be formed of an insulating heat conduction material, so as to ensure a sufficient heat transfer rate between the heat conducting layer 105 and the scan line 104, the data line 103, the first electrode 107.

In FIG. 3, the heat conducting layer 105 is shown to include two separate rectangular regions, but the present embodiment is not limited thereto. The heat conducting layer 105 may have other shapes as need, and the heat conducting layer 105 may be formed to be a continuous single region.

Figure 4:
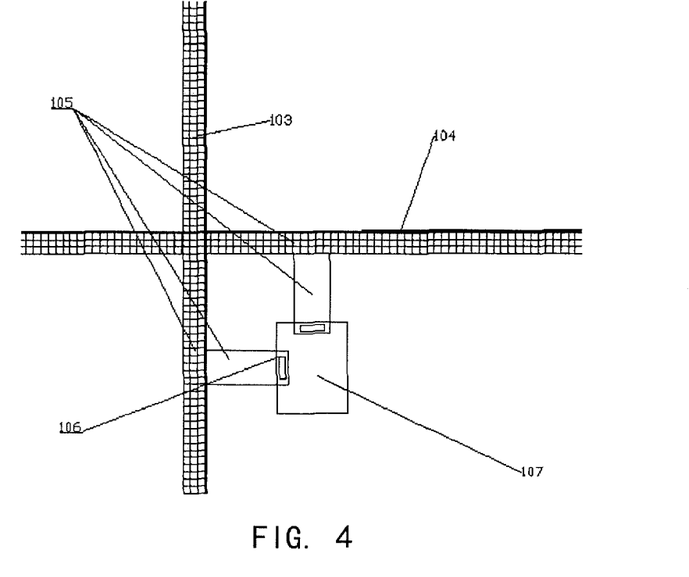
FIG. 4 is a schematic diagram of a pixel in an OLED display panel according to an embodiment of the present disclosure.

In addition, in another embodiment of the present disclosure, the heat conducting layer 105 may have different configurations. FIG. 4 is a schematic diagram of a pixel in an OLED display panel according to an embodiment of the present disclosure. Referring to FIG. 4, the OLED display panel according to the current embodiment of the present disclosure differs from the OLED display panel in FIG. 3 in that, the OLED display panel further includes a second heat conducting layer 105 covering the scan line and the data line respectively. In the present embodiment, the second heat conducting layer and the first heat conducting layer are continuously formed and connected to each other, and thus they are denoted by the same reference numeral 105. However, the present disclosure is not limited thereto. The second heat conducting layer and the first heat conducting layer may also be formed in different layers and connected to each other through a via hole.

Referring to FIG. 4, the second heat conducting layer covers the gate line 104 and the data line 103 respectively. Therefore, in this case, a contacting area between the heat conducting layer 105 and the metal line (the gate line 104 and the data line 103) is further increased, which may better conduct the heat from the OLED to outside by using the heat conducting layer and the metal wire. In an optional embodiment, the second heat conducting layer has the same pattern as the scan line 104 and the data line 103. Therefore, the second heat conducting layer and the scanning line 104 or the data line 103 can be simultaneously formed by the same photolithography process, which improves process efficiency and reduces manufacturing costs.

Figure 5:
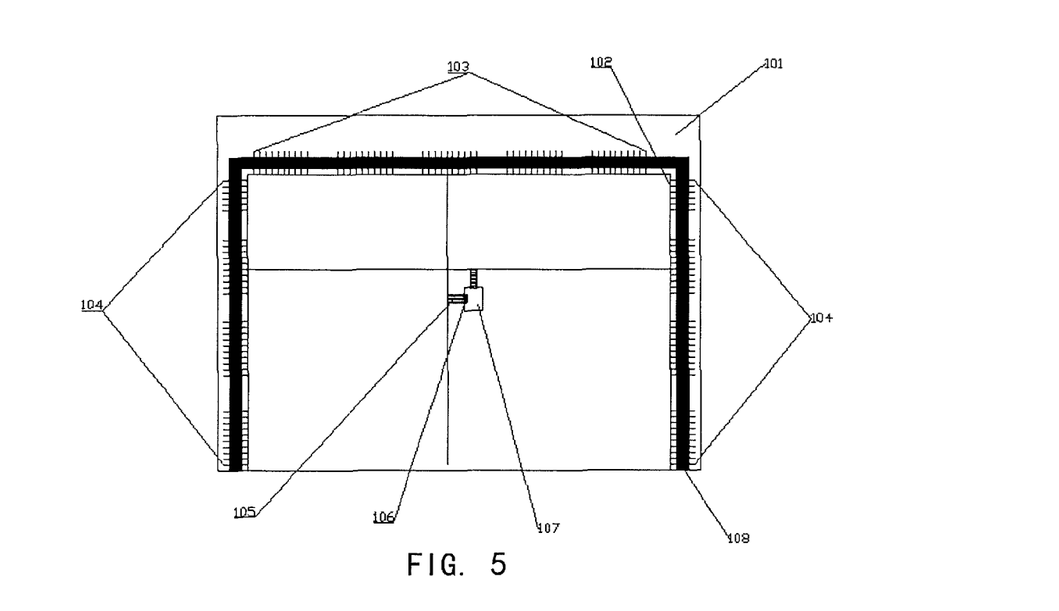
FIG. 5 is a schematic top view of an OLED display panel according to an embodiment of the present disclosure.

According to the above embodiment of the present disclosure, the heat generated by the OLED is conducted from the first electrode 107 to the gate line 104 and the data line 103 through the first heat conducting layer 105, and then the heat is conducted to the heat dissipation structure outside the display panel through the gate line 104 and the data line 105. For example, in one embodiment, as shown in FIG. 5, an external heat sink 108 may also be provided outside the display panel. The external heat sink 108 may be connected to respective gate lines 104 and respective data lines 103. The heat from the OLED is conducted to the external heat sink 108 through the gate line 104 and the data line 103, and then led to the outside of the display panel. Therefore, it may improve heat dissipation of the OLED, thereby avoiding problems such as shift of luminescent chromaticity, reduction of luminous efficiency, product attenuation and the like due to heat generation of the OLED.

According to the present disclosure, the heat conducting layer (including the first and second heat conducting layers) may be formed of an insulating heat conduction material. For example, in one embodiment, a BeO film may be used to form the heat conducting layer. The BeO film may have a thermal conductivity close to the thermal conductivity of Al while having excellent insulating property. Therefore, a BeO film may be used to form the heat conducting layer.

In one embodiment of the present disclosure, a BeO film may be formed using a pyrolysis CVD (pyrolysis chemical vapor deposition) method. A Be(bismuth)-containing salt is used as a source material. The temperature of the Be(bismuth)-containing salt is raised and pyrolysis sublimated in a pyrolysis CVD apparatus, so that a BeO film is deposited on the substrate. Through this method, it is possible to deposit a BeO thin film with a high crystal purity in the thin film and a good structure, so as to improve the heat dissipation of the OLED.

Another embodiment of the present disclosure provides an OLED display, which may include: the OLED display panel according to any embodiment of the present disclosure; a source driver, connected to the data line; and a scan driver, connected to the scan line.

In the present embodiment, the specific description of the OLED display panel can refer to the foregoing embodiments of the present disclosure, which will not be repeated here.

In the present embodiment, the source driver may be a data driver connected to a data line and providing a data signal to the OLED, and the scan driver may be a gate driver providing a scan signal to the OLED. A person skilled in the art can implement the source driver and the scan driver on the basis of the present disclosure, and thus a detailed description of the source driver and the scan driver will be omitted herein.

Figure 6:
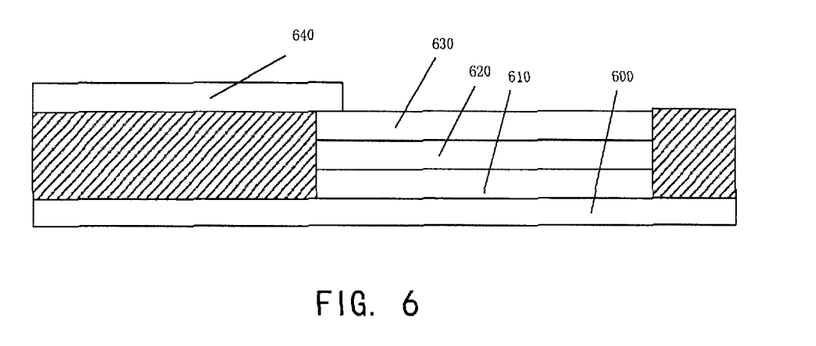
FIG. 6 is a schematic cross-sectional view of an OLED unit according to an embodiment of the present disclosure.

FIG. 6 is a schematic cross-sectional view of an OLED unit according to an embodiment of the present disclosure. Referring to FIG. 6, the OLED unit includes: a bottom electrode 610; an organic light emitting layer 620, formed on the bottom electrode; a transmission electrode 630, formed on the organic light emitting layer 620, and located in a light emitting region of the OLED unit; and a heat conducting layer 640, formed in the non-light-emitting region of the OLED unit and connected to the transmission electrode 630, the heat conductive layer being formed of an insulating heat conduction material.

The light emitting region of the OLED unit corresponds to a region where the organic light emitting layer 620 is located (in other words, corresponding to a region where the transmission electrode 630 is located), and the non-light-emitting region corresponds to a region of the OLED unit other than the light emitting region.

The bottom electrode 610 may be a reflective electrode to reflect light emitted from the organic light emitting layer toward the transmission electrode 630. However, the present disclosure is not limited thereto. According to the light emitting direction of the OLED unit, the bottom electrode 610 may also be formed of a transparent conductive material, so as to be formed as a transmission electrode. The bottom electrode 610 may be formed on the substrate 600, and the substrate 600 may be an array substrate including a circuit structure such as a TFT array.

In FIG. 6, the heat conducting layer 640 is shown to be in direct contact with the transmission electrode 630. However, the present disclosure is not limited thereto. The heat conducting layer 640 may be formed in a different layer and connected to the transmission electrode 630 through a via hole. The heat generated by the OLED can be transferred to the outside through the heat conducting layer 640. The detailed description of the heat conducting layer 640 can be referred to the previous embodiments, which will not be repeated here.

In addition, it should be understood that the heat conducting layer is formed in the non-light-emitting region of the display panel or the OLED in the present disclosure. However, in order to achieve the connection of the heat conducting layer and the first electrode in the light emitting region, at least a portion of the heat conducting layer may be extended to the light emitting region, which should still be understood as that the heat conducting layer is formed in the non-light-emitting region.

In summary, an OLED display panel according to an embodiment of the present disclosure may include: a scan line, extending along a first direction; a data line, extending along a second direction perpendicular to the first direction; an OLED unit, including a first electrode, a second electrode, and an organic light emitting layer formed between the first electrode and the second electrode; and a heat conducting layer, formed of an insulating heat conduction material and connected to the scan line, the data line, and the first electrode in the OLED unit. According to the present disclosure, it may improve heat dissipation of the OLED, thereby avoiding problems such as shift of luminescent chromaticity, reduction of luminous efficiency, product attenuation and the like due to heat generation of the OLED.

It can be understood that the above embodiments are merely exemplary embodiments employed for illustrating the principle of the present disclosure, but the present disclosure is not limited thereto. For a person of ordinary skill in the art, various variations and improvements may be made without departing from the spirit and essence of the present disclosure, and these variations and improvements are also considered to be within the protection scope of the present disclosure.

What is claimed is:

1. An OLED display panel, comprising:
    a scan line, extending along a first direction;
    a data line, extending along a second direction perpendicular to the first direction;
    an OLED unit, comprising a first electrode, a second electrode, and an organic light emitting layer formed between the first electrode and the second electrode; and
    a heat conducting layer, formed of an insulating heat conduction material and connected to the scan line, the data line, and the first electrode in the OLED unit, to form a first heat conducting path from the first electrode to the data line and a second heat conducting path from the first electrode to the scan line.

2. The OLED display panel according to claim 1, wherein the first electrode is an anode.

3. The OLED display panel according to claim 1, wherein the heat conducting layer is formed in a non-light-emitting region of the OLED display panel.

4. The OLED display panel according to claim 1, wherein the first electrode is formed of a transparent conductive material.

5. The OLED display panel according to claim 4, wherein the heat conducting layer is connected to an edge portion of the first electrode.

6. The OLED display panel according to claim 1, further comprising: a second heat conducting layer covering the scan line and the data line respectively.

7. The OLED display panel according to claim 6, wherein the second heat conducting layer has the same pattern as the scan line and the data line.

8. The OLED display panel according to claim 1, wherein the heat conducting layer comprises a BeO film.

9. An OLED display, comprising an OLED display panel, wherein the OLED display panel comprises:
    a scan line, extending along a first direction;
    a data line, extending along a second direction perpendicular to the first direction;
    an OLED unit, comprising a first electrode, a second electrode, and an organic light emitting layer formed between the first electrode and the second electrode; and
a heat conducting layer, formed of an insulating heat conduction material and connected to the scan line, the data line, and the first electrode in the OLED unit, to form a first heat conducting path from the first electrode to the data line and a second heat conducting path from the first electrode to the scan line.

10. The OLED display according to claim 9, wherein the first electrode is an anode.

11. The OLED display according to claim 9, wherein the heat conducting layer is formed in a non-light-emitting region of the OLED display panel.

12. The OLED display according to claim 9, wherein the first electrode is formed of a transparent conductive material.

13. A method of manufacturing an OLED display panel, comprising:
    forming a scan line extending along a first direction and a data line extending along a second direction perpendicular to the first direction;
    forming a heat conducting layer, the heat conducting layer being connected to the scan line and the data line; and
    forming a first electrode, the first electrode being connected to the heat conducting layer,
    wherein the heat conducting layer is formed of an insulating heat conduction material, to form a first heat conducting path from the first electrode to the data line and a second heat conducting path from the first electrode to the scan line.

14. The method of manufacturing an OLED display panel according to claim 13, wherein the first electrode is an anode.

15. The method of manufacturing an OLED display panel according to claim 13, wherein the heat conducting layer is formed in a non-light-emitting region of the OLED display panel.

16. The method of manufacturing an OLED display panel according to claim 13, wherein the first electrode is formed of a transparent conductive material.

17. The method of manufacturing an OLED display panel according to claim 16, wherein the heat conducting layer is connected to an edge portion of the first electrode.

18. The method of manufacturing an OLED display panel according to claim 13, further comprising: a second heat conducting layer covering the scan line and the data line respectively.

19. The method of manufacturing an OLED display panel according to claim 18, wherein the second heat conducting layer has the same pattern as the scan line and the data line.

20. The method of manufacturing an OLED display panel according to claim 13, wherein the heat conducting layer comprises a BeO film.

\* \* \* \* \*